(12) United States Patent
Harroun

(10) Patent No.: US 7,922,864 B2
(45) Date of Patent: Apr. 12, 2011

(54) QUICK-CHANGE PRECURSOR MANIFOLD FOR LARGE-AREA CVD AND PECVD

(75) Inventor: James S. Harroun, Concord, CA (US)

(73) Assignee: OptiSolar, Inc., Hayward, CA (US)

( * ) Notice: Subject to any disclaimer, the term of this patent is extended or adjusted under 35 U.S.C. 154(b) by 621 days.

(21) Appl. No.: 11/943,065

(22) Filed: Nov. 20, 2007

(65) Prior Publication Data

US 2009/0126632 A1 May 21, 2009

(51) Int. Cl.
*C23C 16/00* (2006.01)
*C23F 1/00* (2006.01)
*H01L 21/306* (2006.01)

(52) U.S. Cl. .............................. 156/345.34; 118/723 E
(58) Field of Classification Search .............. 156/345.34; 118/723 E
See application file for complete search history.

(56) References Cited

U.S. PATENT DOCUMENTS

| | | | |
|---|---|---|---|
| 3,464,436 A * | 9/1969 | Bruning | 137/237 |
| 6,294,740 B1 * | 9/2001 | Van Swearingen | 174/151 |
| 7,575,024 B2 * | 8/2009 | Zeiber et al. | 137/614.05 |

* cited by examiner

*Primary Examiner* — Keath T Chen
(74) *Attorney, Agent, or Firm* — Weiss & Moy, P.C.; Jeffrey Weiss; Jeffrey D. Moy

(57) ABSTRACT

A tube-array showerhead for CVD or PECVD on large substrates delivers precursors to a process chamber via an array of tubes drilled with precision holes. The tubes rapidly become contaminated with use and must be changed frequently to maintain process quality. An improved manifold for a tube-array showerhead, intended for processes with a low pressure differential between the tubes and process chamber, includes holding-stubs to hold each tube by its ends outside the manifold block. At least one holding-stub for each tube is spring-loaded along the direction of the tube's operating axis. Contaminated tubes can be removed, and clean tubes installed, without disassembling the manifolds or disturbing any high-pressure-differential seals to the ambient atmosphere or precursor supplies. This invention reduces production costs by decreasing chamber down-time and reducing the risk of creating leaks when tubes are changed.

11 Claims, 8 Drawing Sheets

Assembled cutaway view of spring-loading manifold of preferred embodiment

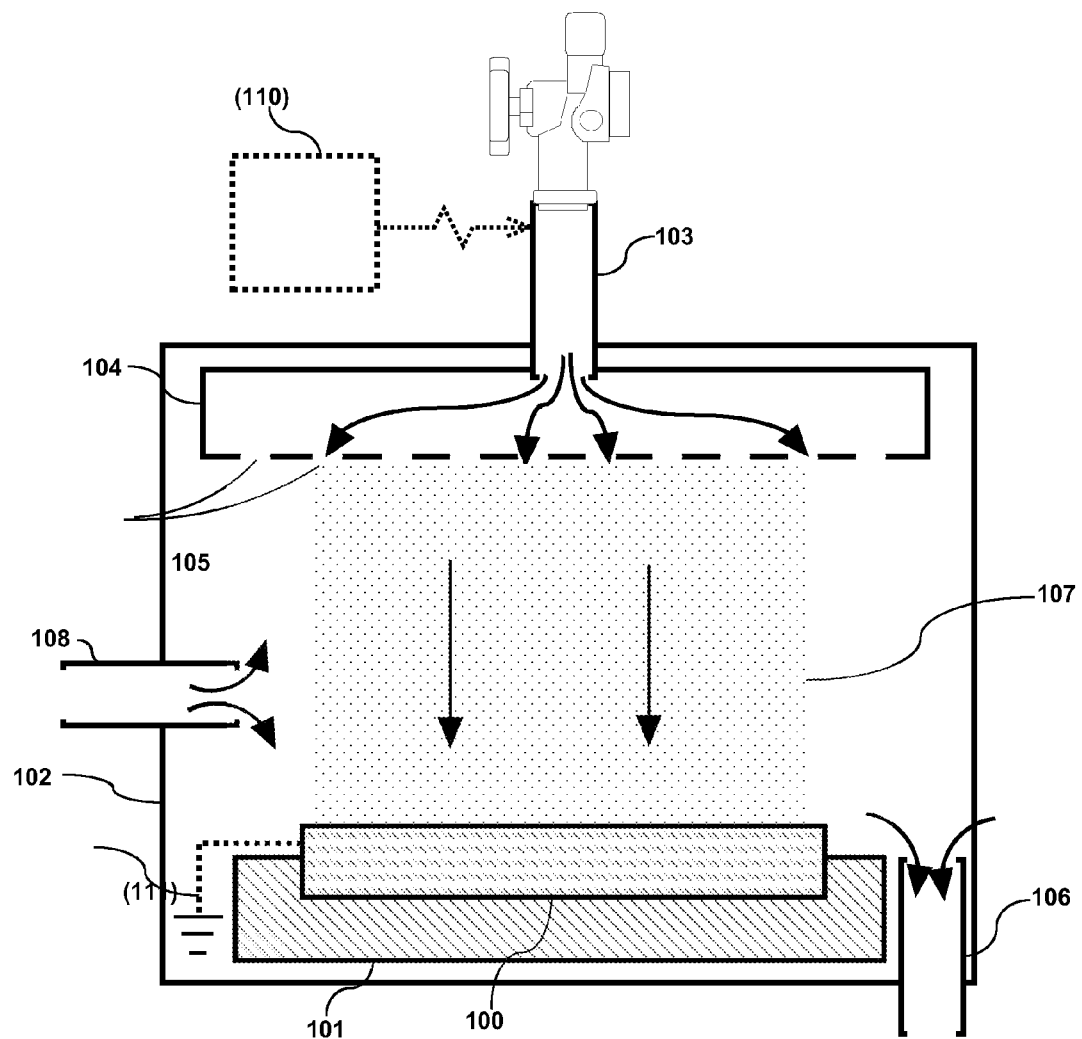
FIG. 1. Conceptual diagram of a basic CVD (or PECVD) apparatus

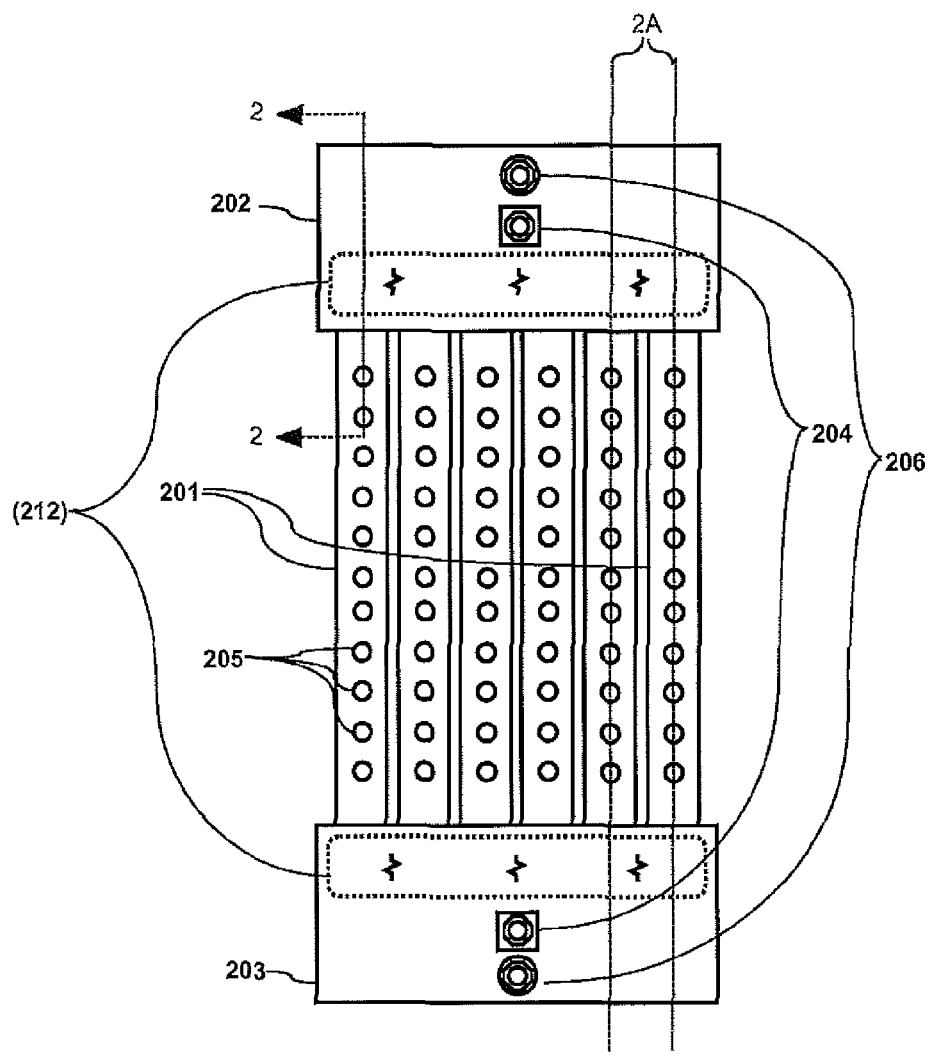
FIG. 2. Conceptual diagram of a tube-array showerhead designed for CVD (or PECVD) of large rectangular substrates or substrate arrays
(Prior Art)

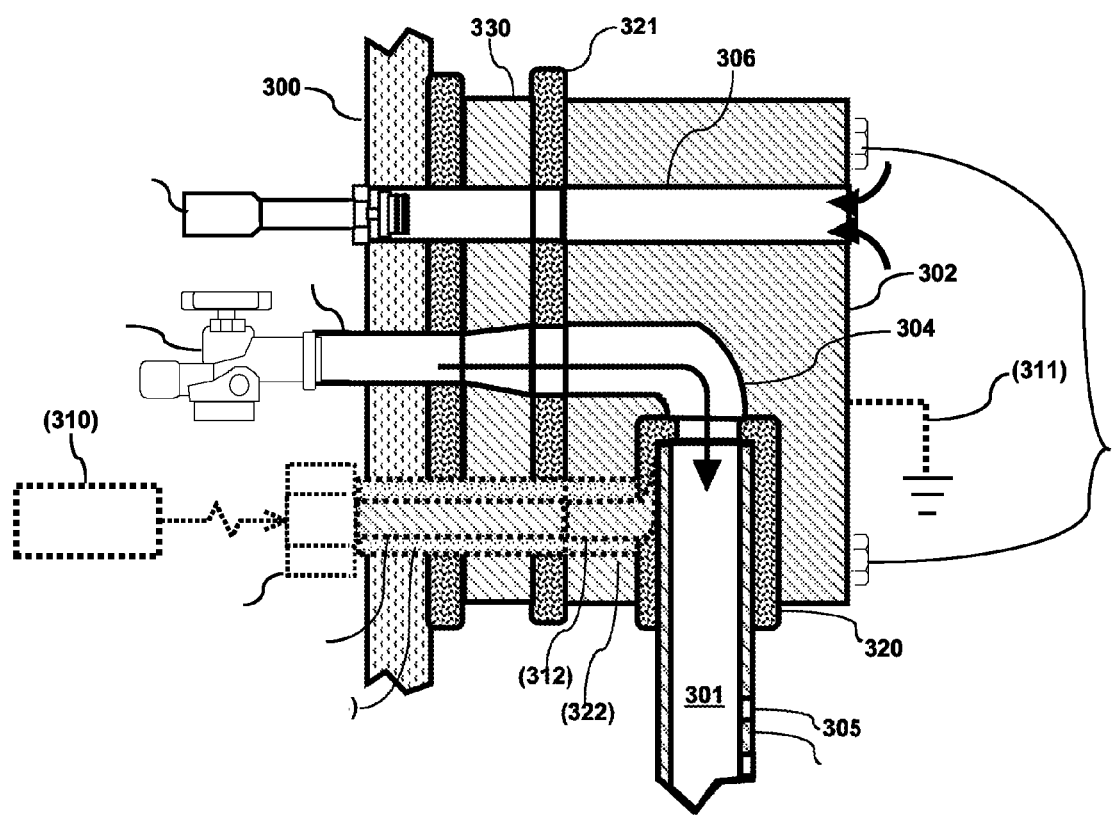
FIG. 3. Conceptual cross-section of upper part of tube-array showerhead attached to chamber wall
(Prior Art)

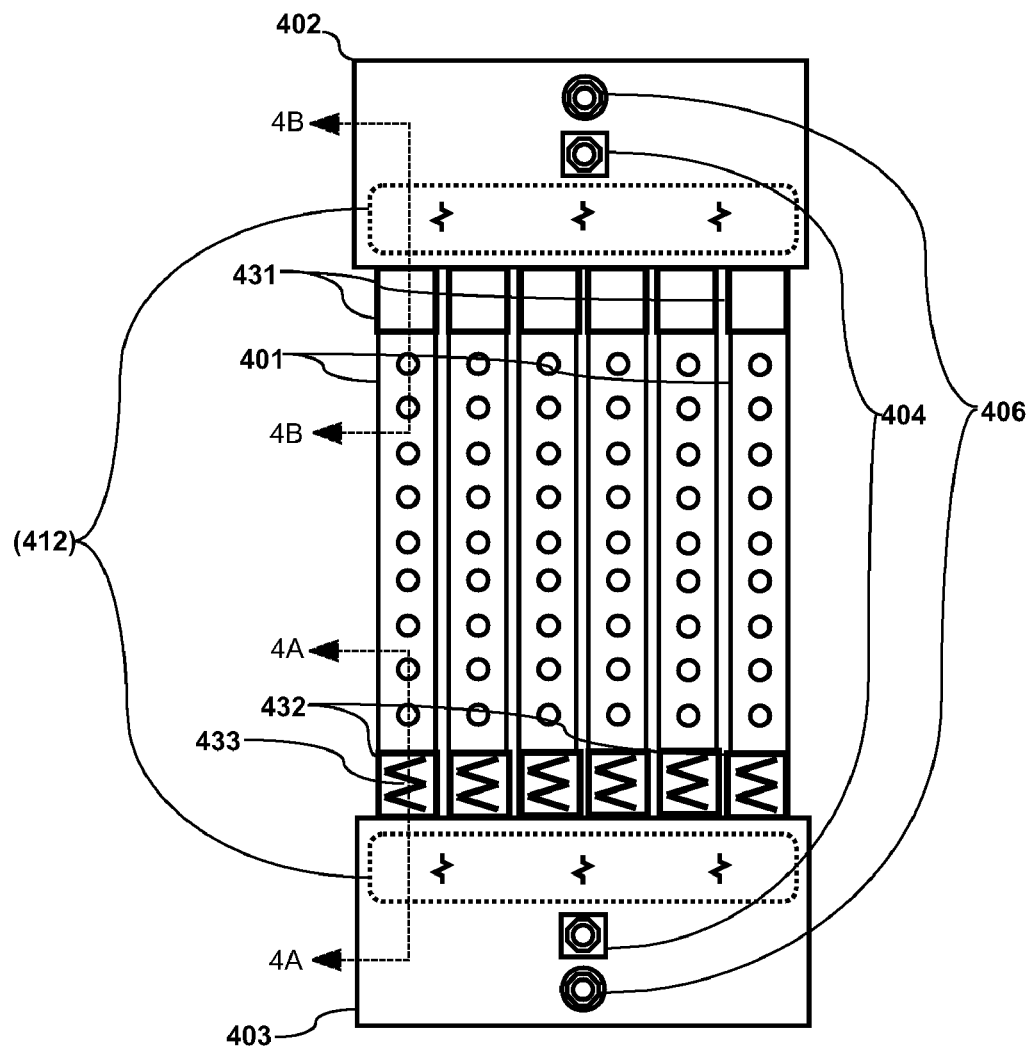
FIG. 4. Conceptual diagram of a in improved plasma-delivery assembly for a PECVD chamber specialized to process solar panels

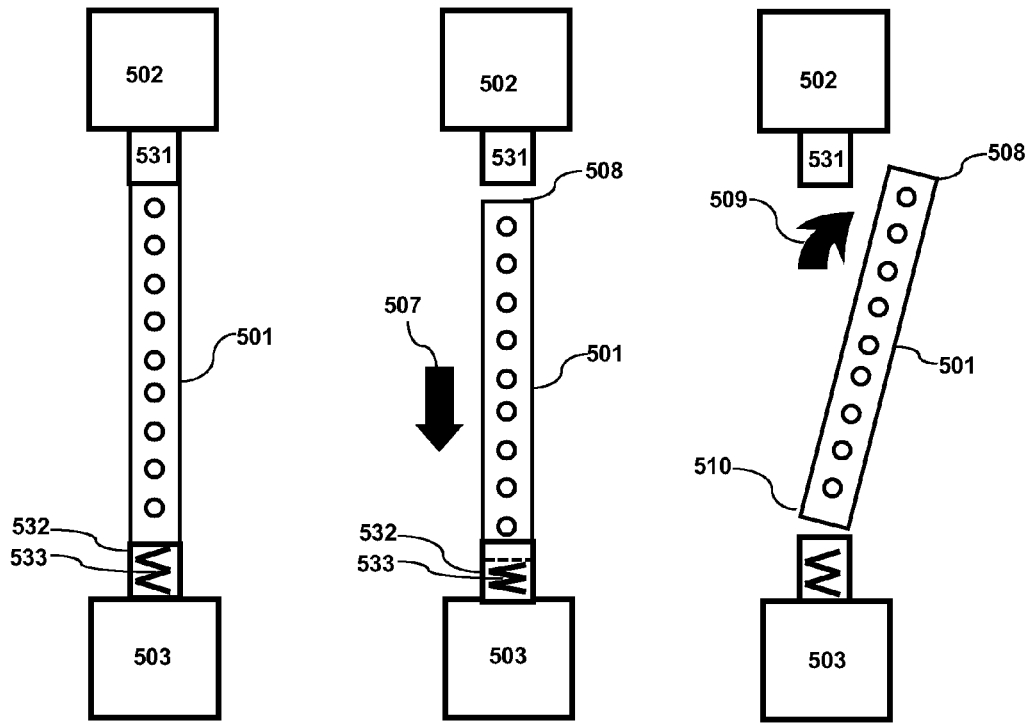
FIG. 5a. Side view of single tube in place between holding stubs
FIG. 5b. Spring in spring-loaded holding stub is compressed to free other end of tube
FIG. 5c. Tube is tilted and pulled out of spring-loaded holding stub to free other end
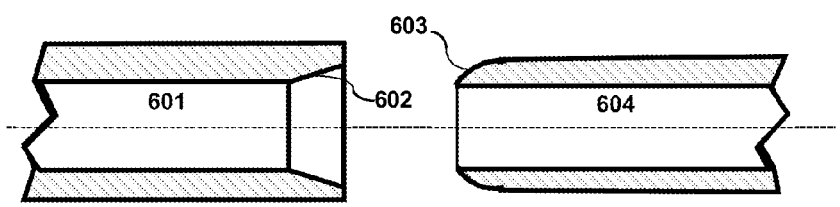
FIG. 6. Cross-section of mating surfaces of tube and holding stub in preferred embodiment

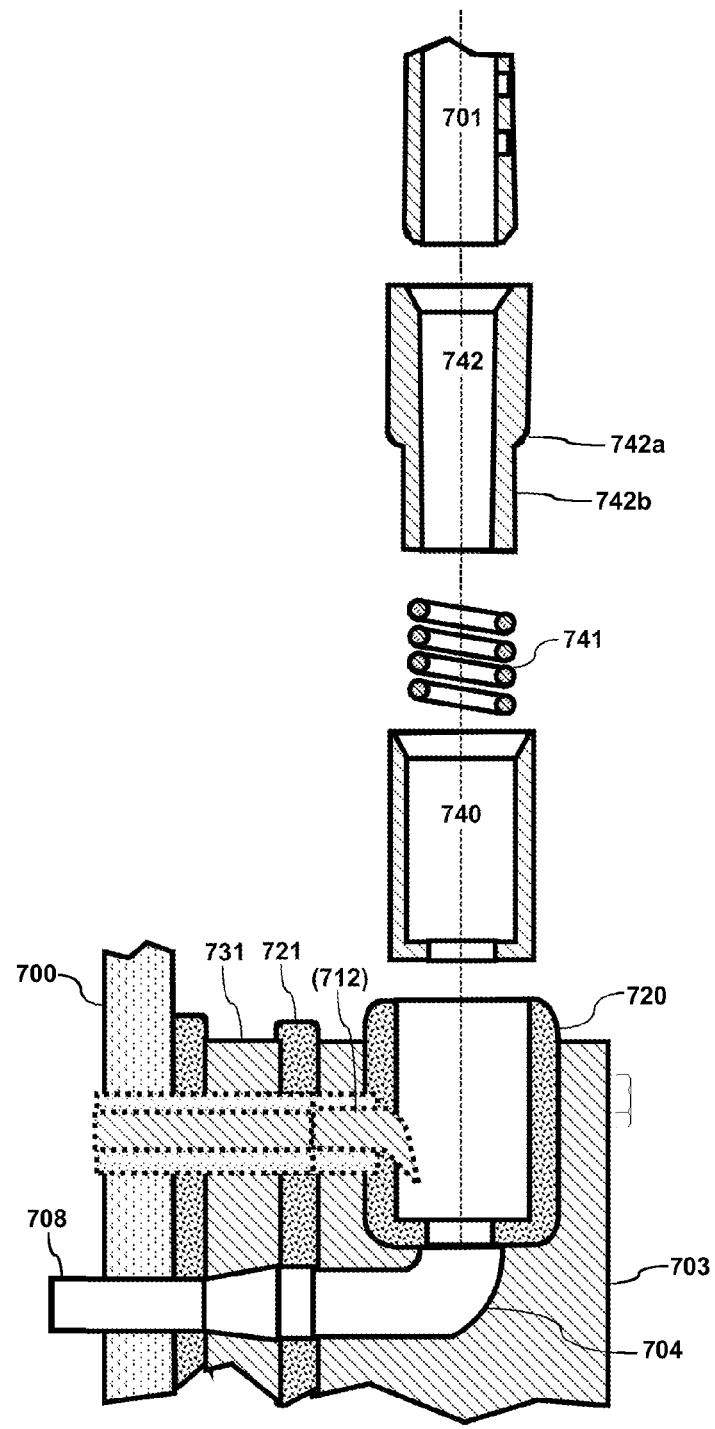
FIG. 7a. Partially-exploded cutaway view of spring-loading manifold of preferred embodiment

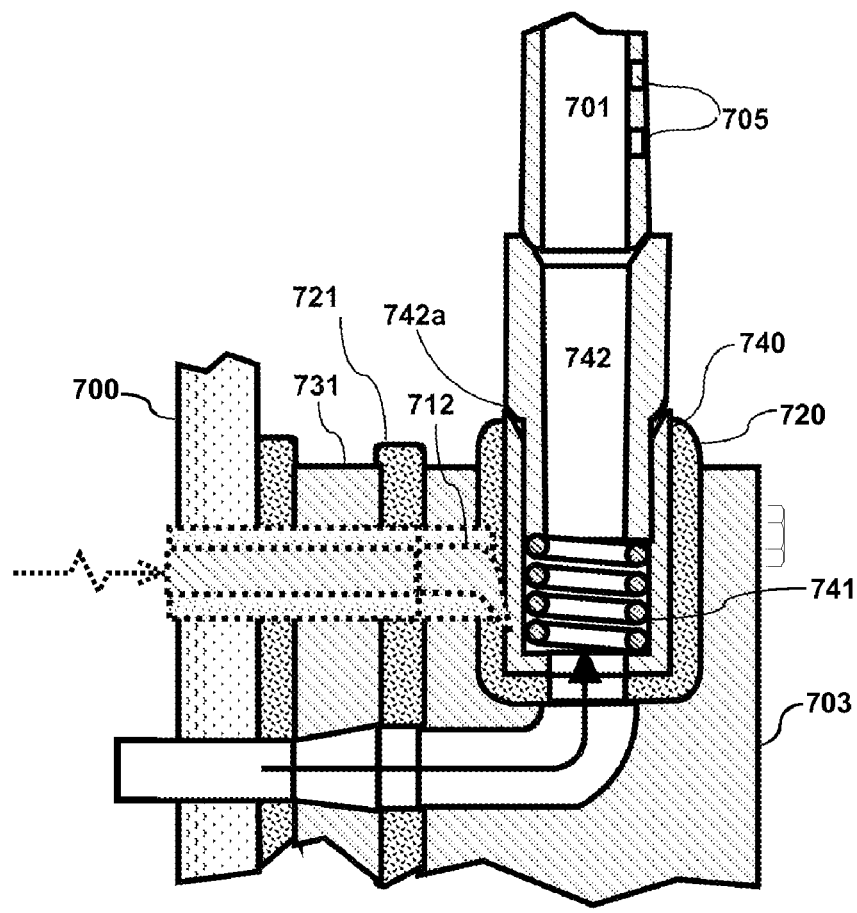
FIG. 7b. Assembled cutaway view of spring-loading manifold of preferred embodiment

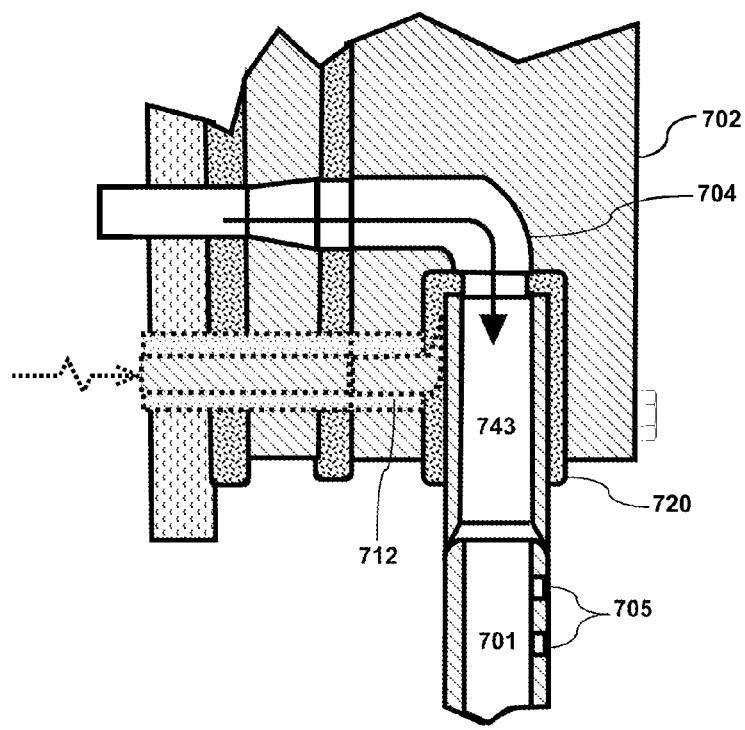
FIG. 7c. Assembled cutaway view of fixed manifold of preferred embodiment

QUICK-CHANGE PRECURSOR MANIFOLD FOR LARGE-AREA CVD AND PECVD

RELATED APPLICATIONS

None

FEDERALLY SPONSORED RESEARCH AND DEVELOPMENT

None

APPENDICES

None

BACKGROUND OF THE INVENTION

This invention is related to chemical vapor deposition (CVD) and plasma-enhanced chemical vapor deposition (PECVD) apparatus, and to methods for maintaining such apparatus in good working order. In particular, it relates to gas and plasma distribution hardware (fluent material supply or flow-directing means with plasma) for vacuum coating of large-area substrates made of glass, other dielectrics, or other materials.

CVD and PECVD is a widely used method of applying precision coatings to substrates. Applications include semiconductor processing, optics, and specialty vessels and containers. In CVD, gaseous precursors containing particles of the desired solid material react and decompose at the substrate surface, leaving behind a solid coating. PECVD is a type of CVD that uses plasma excitation to accelerate precursor reaction. Among other advantages, the plasma excitation can enable deposition at reduced temperatures.

FIG. 1 is a schematic diagram of a basic CVD or PECVD chamber. The components needed for CVD are drawn in solid lines with plain reference numbers, and the extra components needed for PECVD are drawn with dotted lines and reference numbers in parentheses. Substrate 100 is held by holder 101 in a deposition chamber 102. Holder 101 may include control means for substrate temperature or surface charge to help particles 107 adhere to substrate 100. Chamber 102 may be operated at atmospheric pressure, low pressure, or high vacuum. Gaseous precursors enter through precursor inlet 103 and are evenly distributed in the vicinity of substrate 100 by passing through a precise array of holes 105 in precursor distributor 104. Precursor distributor 104 may be cooled. The precursors carry coating-material particles 107 to the surface of substrate 100, where they decompose out of the precursors and adhere to the substrate surface and to each other, forming the coating. Exhaust 106 removes waste components of the precursors, and at least some of the particles 107 that do not adhere to the substrate surface. Between deposition cycles, purging, passivating, or cleaning agents may be injected into chamber 102 through an auxiliary inlet 108.

In PECVD, the precursors are excited into a plasma by an electric field from a plasma excitation source (110). The electric field may be created on or in precursor distributor 104 via an electrical connection from excitation source (110) to precursor inlet 103. A ground connection (111) is provided for substrate 100. The plasma decomposes the precursors and deposits coating-material particles 107 on the surface of substrate 100, where they adhere.

As with similar coating methods, CVD and PECVD result in unwanted deposits on non-target surfaces, as well as those intended on the target substrate. Coating particles, reaction residues, and waste by-products are also deposited on other accessible surfaces inside the chamber: for example, on the inner chamber walls, the precursor distributor surfaces, the inlet and exhaust lines, and the substrate holder. These unwanted deposits can degrade the performance of chamber hardware. In particular, when unwanted deposits build up on the precursor distributor, some of its precision holes may become partially or completely blocked, degrading the efficiency and uniformity of the precursor distribution and the resulting coatings. If the precursor distributor is also a plasma source, deposit buildup may make the plasma more difficult to ignite, or render the electrodes more susceptible to arcing or overheating. Additionally, fragments or components of these unwanted deposits can detach from the chamber hardware during subsequent deposition cycles. If these fragments or components land on a substrate, they contaminate the composition or degrade the uniformity of the coating on that substrate. Therefore, if unwanted deposits cannot be avoided, they must regularly be removed from the chamber by cleaning or replacing the affected hardware.

Inventive work on removing deposits on chamber hardware falls into three main categories: (1) in situ non-invasive cleaning, where the chamber remains sealed during cleaning, (2) in situ invasive cleaning, where the chamber is opened and the hardware is cleaned in place, and (3) off-line cleaning, where the chamber is opened and the dirty hardware is removed, cleaned, and replaced, or removed and swapped out for clean replacements. For example, in U.S. Pat. No. 6,576,063, Toyoda et al. non-invasively clean the chamber and discharge tube using an etch-gas active species generated by a remote plasma source built permanently into the apparatus. In U.S. Pat. No. 6,110,556, Bang et al. machine specially designed throughways in a chamber lid to aim a cleaning gas asymmetrically toward the areas with the highest likelihood of unwanted deposits. In U.S. Pat. No. 4,657,616, Benzing et al. temporarily install a special cleaning manifold comprising a gas inlet, electrodes, and RF excitation electronics, unsealing the chamber but cleaning the hardware in situ and limiting the opportunity for contaminants to enter the chamber.

Some pieces of chamber hardware, and some types of deposits, do not respond well to convenient in situ methods. In addition, many in situ cleaning methods, apparatus, and agents are expensive. In such cases, the chamber must be opened and hardware must be removed for cleaning. In U.S. Pat. Nos. 6,374,841 and 6,234,219, Donohoe installs a removable chamber lining that can be replaced with a clean one, as do Frankel et al. in U.S. Pat. No. 6,444,037 and Chu et al. in U.S. Pat. No. 6,120,660. In U.S. Pat. No. 6,719,851, Kurita et al. introduce a chamber lid designed to be easily opened, closed, and rotated to facilitate wet cleaning of the chamber hardware. In U.S. Pat. No. 5,906,683, Chen et al. mount a baseplate with integral gas inlet and cooling-fluid inlet and outlet to reduce the number of vacuum-seal components in the lid that must be checked for intactness and carefully replaced during post-cleaning reassembly of the chamber.

Accumulation of unwanted deposits on precursor distributors can be especially problematic. Parts of these components are not easily accessed by in situ cleaning-agent flows. Gentle cleaning methods can take a long time to remove the deposits; and more vigorous cleaning methods can roughen or distort the precision edges of the precursor distribution holes. In U.S. Pat. No. 5,597,439, Salzman mounts a gas distribution ring with adjustable slots to a gap between an etch chamber's ceramic dome and its lower sidewall; the gap acts as a manifold channel when the chamber is sealed, and the distribution ring easily lifts out when the chamber is unsealed. In U.S. Pat.

No. 5,997,649, Hillman stacks the precursor distributor "showerhead" (so called because the circular precursor distributors used for coating small circular substrates look like bathroom showerheads) with upper and lower insulators for easy removal and replacement. In U.S. Pat. Nos. 6,050,216 and 6,170,432, Szapucki et al. configure disk-shaped showerheads to easily mount and dismount with split collars made in two semicircular parts.

Modular approaches to semiconductor processing chambers are becoming popular, both for ease of invasive maintenance procedures and for configuration flexibility. In U.S. Pat. No. 5,948,704, Benjamin et al. use a universal housing with standardized mating mounts for a plasma source, substrate holder, and vacuum pump. In U.S. Pat. No. 6,890,386, DeDontney et al. build a precursor manifold out of modular pairs of gas injectors flanking a central exhaust outlet; the modules are easy to replace and the manifold can be easily built in a range of sizes. In U.S. Pat. No. 6,424,082, Hackett et al. use self-aligning contoured surfaces to enable quick replacement of consumable hardware in material-processing equipment, such as electrodes, swirl rings, nozzles, and shields. In U.S. Pat. No. 6,983,892, Noorbakhsh et al. bond the gas distributor to a removable electrode to form a removable module with space for an insert that prevents premature ignition.

Most of these prior-art advances in easily changeable precursor distributors are geared toward semiconductor processing, where the substrate is generally a circular wafer measuring 200 mm or less in diameter and the precursor distributor is configured to match. For substrates that are much larger, a single solid showerhead becomes too large and heavy for one technician to remove and replace easily. Besides, many large substrates that benefit from CVD and PECVD coating, such as solar panels, flat-panel displays, vehicle windshields, and architectural windows, are rectangular rather than circular. Even relatively small substrates, such as lenses and mirrors, are often coated in batches rather than one at a time, and a rectangular array of parts often allows better packing density than a circular array. These applications therefore require a very different plasma-delivery geometry and scale from those useful for wafer processing. Other rectangular substrates may require similar geometries.

FIG. 2 is a conceptual diagram of one type of precursor distributor designed for coating large rectangular substrates or rectangular arrays of substrates: the "tube-array showerhead." (The diagram is not to scale and is not intended to represent any particular prior-art design). Instead of a single solid showerhead, the precursors flow into an array of removable tubes 201. Each individual tube may be long, but is narrow and lightweight enough for a single technician to maneuver. Tubes 201 are held along operating axes 2A, fed with precursors, and sealed by first manifold 202 and second manifold 203. The two manifolds 202 and 203 may or may not be symmetric. Precursors enter through at least one gas inlet 204 in one or both of the manifolds, and pass through to the processing chamber through multiple precision-drilled holes 205 in each of the tubes 201. Manifolds 202 and 203 may also include exhaust ports 206. For coating processes requiring sub-atmospheric pressure, manifolds 202 and 203 must seal ambient air out of the process chamber. The ends of tubes 201 must also be sealed to keep the incoming precursors channeled down the tubes and out through holes 205.

A tube-array showerhead can be used for PECVD if electrodes or other plasma excitation connections (212) are connected to the tubes. In that case, the tubes must somehow be insulated from the process chamber and from each other.

To preserve quality and uniformity in the coatings, the tubes in a tube-array showerhead must be cleaned whenever deposits build up on the tube surfaces and around the edges of the precision-drilled gas inlet holes. In situ cleaning is possible with some highly reactive cleaning agents, but these agents are very expensive and can greatly reduce the useful life of the showerhead, particularly if the holes are small. Removing the tubes and using a gentler cleaning solution is less expensive in terms of both cleaning agents and tube life.

To remove the tubes from a prior-art tube-array showerhead known to the inventor, one of the manifolds must be removed or partially disassembled to free one end of each tube. Next, the tubes are pulled free of the other manifold, which remains attached to the chamber. Clean or new tubes are then inserted into the manifold that remained attached to the chamber. Finally, the manifold that was removed or disassembled is replaced around the free ends of the clean tubes. In a mass-production environment, the tubes may need to be removed and cleaned weekly, or even more often.

FIG. 3 is a conceptual cross-section (through what would be section 2-2 in FIG. 2) of the assembled top portion of a tube-array showerhead according to a prior-art design. (In this design, the two manifolds are symmetric, so only one of them need be shown). The components needed for CVD are drawn in solid lines with plain reference numbers, and the extra components needed for PECVD are drawn with dotted lines and reference numbers in parentheses. Each end of tube 301 slides into a channel in manifold block 302, which is attached to chamber wall 300 by fasteners 303. Precursors from removable precursor inlet valve 307 enter the chamber through plenum inlet 308 to be distributed by channels in plenum 330 to each precursor inlet 304 in manifold block 302, and from there into tube 301, where they enter the chamber through precision holes 305. Waste products in the chamber are exhausted through exhaust port 306 in manifold block 302, back through one or more exhaust channels in plenum 330, through chamber wall 300, and into exhaust line 308. Tube seal 320 seals tube 301 to manifold block 302. Block seal 321 seals manifold block 302 to plenum 330.

The PECVD version of the prior-art tube-array showerhead of FIG. 3 requires additional components and functions. Plasma excitation source (310) sends its output to removable connector (314), which connects to bulkhead lead (313) through the chamber wall. When manifold block 302 is attached to plenum 330, bulkhead lead (313) makes electrical contact with electrode (312). Electrode (312), which has some spring-like qualities due to being hardened and bent, penetrates tube seal 320 to electrically contact conductive tube 301. This allows tube 301 to create an electric field that excites incoming precursors into a plasma. The need to confine the plasma electric fields requires a ground connection (311) on conductive manifold block 302, insulation (323) on bulkhead lead (313), and insulation (322) on electrode (312). In addition, tube seal 320 and block seal 321 need to be good insulators, or to be lined with good insulators, for PECVD operation.

When the tubes in this type of tube-array showerhead need cleaning or replacement, at least one of the manifold blocks must be unfastened and partially disassembled to disengage one end of each tube. Next, each tube must be extracted from the remaining manifold block. Each tube must be freed from its tube seals. In some PECVD designs, the electrodes must also be removed and replaced to access the tubes. All these procedures require the use of one or more particular tools. Performing these steps, and then reversing them to install clean tubes, can take 2 to 3 hours in a typical 48-tube chamber (not counting release and restoration of vacuum, or any purge or passivation steps). This frequent and extended down-time for the chamber is a disadvantage of the prior art because it adds to the cost of producing solar panels.

Every mechanical disturbance of a seal creates a risk of vacuum-chamber leakage. This is another disadvantage of the prior art in tube-array showerheads, because at least one block seal and all the tube seals are necessarily disturbed whenever the tubes are changed in the prior-art design, When surfaces of seals are exposed, particles may cling to them and they may be scratched or abraded. Any mechanical stress on a seal in an unintended direction, such as stretching, can enlarge existing defects. Even new replacement seals may be defective. Unfortunately, the only way to find a leak in the prior-art design is by fully reassembling the tube-array showerhead in the chamber, closing the chamber, and drawing down the pressure. If a leak is detected then, the tube-array showerhead must be disassembled again, and each seal examined carefully to identify the faulty one. This process can be difficult and time-consuming, and costly because the chamber remains inoperable.

Therefore, a need exists for a tube-array showerhead design that allows quicker removal and replacement of dirty or malfunctioning tubes, with a decreased risk of creating leaks in the process.

BRIEF SUMMARY OF THE INVENTION

An object of this invention is to reduce the time required to change tubes in a tube-array showerhead. While the tubes are being changed, the chamber cannot operate, but overhead costs continue to accrue. Therefore, reducing the time it takes to change the tubes will reduce the cost of production. To achieve this object, the invention includes an improved pair of manifolds that enables tool-less removal and replacement of plasma-delivery tubes. These improvements reduce the time to change tubes from the 2-3 hours typical of the prior art to 15-20 minutes.

Another object of this invention is to reduce the risk of creating leaks while changing the tubes in a tube-array showerhead. If leaks are created, the processing chamber cannot be properly evacuated after the tubes are replaced. In this event, no more substrates can be processed until the leak is repaired. The repair process is also down-time for the chamber that increases overhead costs. Therefore, reducing the risk of leak creation during the frequent routine-maintenance process of changing the tubes will also reduce the cost of production. To achieve this object, the invention includes tube-retention assemblies that allow tubes to be removed from, and replaced in, the processing chamber without disturbing the seals; leaving functioning seals in place will avoid leak creation.

Another object of this invention is to retain the advantages of supplying mechanical support, gas delivery, and plasma excitation to the tubes through an integrated manifold. To achieve this object, the invention includes gas inlets, electrical contacts, electrical insulation, mechanical stress relief, mechanical alignment, and vacuum seals in an improved manifold block design.

BRIEF DESCRIPTION OF THE DRAWINGS

FIG. 1 is a conceptual diagram of a basic CVD/PECVD chamber apparatus.

FIG. 2 is a conceptual diagram of a tube-array showerhead for use in a CVD/PECVD chamber designed for processing large substrates.

FIG. 3 is a conceptual cross-section of the upper part of a tube-array showerhead attached to a chamber wall.

FIG. 4 is a conceptual diagram of a tube-array showerhead according to the present invention.

FIGS. 5a, 5b, and 5c show the steps for removing a tube from a tube-array showerhead according to the present invention.

FIG. 6 is an exploded cross-sectional view of a tube and holding-stub in the preferred embodiment, showing their mating surfaces.

FIG. 7a is a partially exploded cross-sectional view of a spring-loading manifold in the preferred embodiment.

FIG. 7b is an assembled cross-sectional view of a spring-loading manifold in the preferred embodiment.

FIG. 7c is an assembled cross-sectional view of a fixed manifold in the preferred embodiment.

DETAILED DESCRIPTION OF THE INVENTION

In many CVD and PECVD applications, the difference in gas pressure between the showerhead and the chamber is fairly small. Therefore, while the seals that isolate the chamber and its components from the outside atmosphere must generally have high strength and integrity, the requirements on joints between components wholly within the chamber may often be relaxed considerably without detracting from the intended gas-distribution function. The present invention takes advantage of this situation.

FIG. 4 is a conceptual diagram of a tube-array showerhead according to this invention. Similar to the prior-art diagram FIG. 2, tubes 401 are supplied with precursors via precursor inlets 404 in manifold blocks 402 and 403. Manifolds 402 and 403 may also include exhaust ports 406 to remove waste products from the chamber. The PECVD embodiment would also include plasma excitation connections (412).

The difference between the present invention and the prior art is that the ends of tubes 401 are mechanically positioned and supported by couplers that include holding-stubs 431 and 432. Holding-stubs 431 and 432 extend outside manifold blocks 402 and 403, so that both ends of tubes 401 are also located outside manifold blocks 402 and 403. At least one of holding-stubs 431 and 432 is spring-loaded by a compression spring 433.

In a preferred embodiment, one set of holding stubs (431 in FIG. 4) are substantially fixed in place, and the opposing set of holding-stubs (432 in FIG. 4) are spring-loaded. However, those skilled in the art will recognize that this invention can include other embodiments in which either one or both holding-stubs for each tube are spring-loaded.

FIGS. 5a, 5b, and 5c illustrate a tools-optional method (which can be performed with a gloved hand or a suitable pair of tongs or other gripping tool) of removing a tube from the tube-array showerhead of the present invention. For simplicity, the diagram shows a single tube.

FIG. 5a shows tube 501 in its operating position, held in place by holding-stubs 531 and 532. Holding-stub 532 is spring-loaded with compression spring 533. FIG. 5b shows tube 501 being pushed in direction 507 against compression spring 533, compressing spring 533 until end 508 of tube 501 is disengaged from opposite holding-stub 531 and free of mechanical obstruction. FIG. 5c shows tube 501 being manipulated off its operating axis in direction 509, rotating tube end 508 completely free of the rest of the assembly and disengaging remaining end 510 of tube 501 from holding-stub 532. This releases compression spring 533 and allows tube 501 to be completely removed.

To replace tube 501, the preceding steps are simply reversed: engage one end of tube 501 with spring-loaded holding-stub 532, press tube 501 against holding-stub 532 to compress compression spring 533 until the other end of tube 501 can be manipulated to approach holding-stub 532, allow spring 533 to decompress until the opposite end of tube 501 engages opposite holding-stub 532, and release tube 501 into its operating position.

In a preferred embodiment, the mating ends of the tubes and holding-stubs are self-aligning and have no significant gaps in their contact perimeters. Significant gaps would cause gas leaks, which would cause non-uniformities in the plasma even for small gas-pressure differentials, which in turn would produce non-uniform processing results on workpieces. FIG. 6 shows a longitudinal cross-section of the mating ends of the tube and holding-stub in the preferred embodiment. Tube end 601 has an inner taper 602, which is a concave conical surface. An outer convex spherical surface 603 on mating end of holding-stub 604 seats in inner taper 602. The complementary shapes cause tube end 601 to slide easily onto holding-stub 604 even if initially held at a slight angle. Spherical surface 603 makes an unbroken circle of contact with taper 602. Where the pressure differential between the tubes and the chamber is low, the spring-loading on this circle of contact is strong enough to confine the flowing gas; this type of joint does not leak. In a PECVD embodiment, where the tubes also need to conduct electrical energy to create a plasma, the full circle of contact ensures a uniform electric field all around the perimeter of the tube.

FIG. 7a is a partially-exploded cross-sectional view, analogous to a section 4A-4A in FIG. 4, of a preferred embodiment of a spring-loaded manifold. FIG. 7b is an assembled cross-sectional view of the same embodiment. As in the prior art, precursors from a source outside chamber wall 700 enter through plenum inlet 708, to be distributed by gas plenum 731 to precursor inlets 704 in manifold block 703. Electrode 712 conducts electricity to form a plasma. The precursor path in the manifold block is sealed by block seal 721 and tube seal 720. However, in the preferred embodiment, tube 701 with precision holes 705 does not directly contact tube seal 720. Instead, tube 701 receives its precursors, plasma excitation, and mechanical support outside manifold block 703 by its contact with spring-loaded holding-stub 742, which features a shoulder 742a and a narrowed snout 742b. The narrowed snout 742b of spring-loaded holding-stub 742 rides on compression spring 741. Both compression spring 741 and narrowed snout 742b slide into sheath 740. Sheath 740 is sealed into manifold block 703 by tube seal 720 and makes electrical contact with electrode 712.

In the preferred embodiment, the mating ends of tube 701 and spring-loaded holding-stub 742 mate as conical and spherical surfaces, as do the end of sheath 740 and shoulder 742a of spring-loaded holding-stub 742. When the tube-array showerhead is assembled with tubes 501 in place, as in FIG. 7b, each tube 501 compresses compression spring 741, pressing shoulder 742a against the top of sheath 740. The return force of compression spring 741 presses the top of spring-loaded holding-stub 742 against the mating end of tube 701. Because the gas pressure inside manifold block 703 is only slightly greater than that outside it, the pressure on the mating parts is enough to keep precursors from leaking into the chamber anywhere except through holes 705 in tube 701.

In the preferred embodiment, only one end of each tube is spring-loaded (although this invention contemplates embodiments with both ends spring-loaded). The other end is held by a fixed holding-stub as in FIG. 7c, which is analogous to a cross-section through 4B-4B in FIG. 4. Fixed holding-stub 743 receives precursors from precursor inlet 704 of manifold 702, and plasma excitation from electrode 712. Tube seal 720 seals fixed holding-stub 743 into manifold block 702. The bottom of fixed holding-stub 743 and the mating end of tube 701 mate as conical and spherical surfaces, and the mating parts are held in place by the return force of spring 741 in the opposing manifold 703 shown in FIG. 7b.

In the preferred embodiment, when a tube is removed for cleaning or swapping with a replacement, only the spring-loaded holding-stub and its spring need to move at all, and that movement is very small. Because both holding-stubs stay assembled to their respective manifold blocks, the tube seals, block seals, and electrodes are undisturbed.

The tubes of the tube-array showerhead of the present invention may this be changed very quickly and without special tools, significantly reducing the down-time associated with routine cleaning and replacement of the tubes. Furthermore, the main seals that isolate the chamber components from the atmosphere outside the chamber are substantially undisturbed by the tube-changing process enabled by the present invention. Because neither of the manifold blocks is removed in the process, the block seals are undisturbed. Because the holding-stubs remain in contact with the tube seals throughout the tube-changing process, the tube seals are only subject to minor compression and decompression in the process, rather than the complete removal and potential stretching inherent in the prior-art process. Therefore, the risk of creating leaks while changing the tubes is significantly reduced by the present invention. Those skilled in the art will recognize that the scope of this invention is not limited by the preferred embodiments in this description or in the drawings, but only by its claims.

The invention claimed is:

1. A tube-array showerhead, comprising:
   two precursor plena, each having at least one plenum inlet for receiving precursors to be distributed,
   two manifold blocks, attached to the precursor plena and each having at least one precursor inlet for receiving precursors from the attached plenum,
   at least one pair of tube seals, where one of the seals in each pair is inserted in each manifold block to seal the precursor inlet,
   at least one compressible spring attached to at least one of the manifold blocks opposite the tube seal,
   at least one pair of holding-stubs, where
      one of the holding-stubs in each pair is sealed into each of the manifold blocks by the tube seal inserted in the manifold block, and
      at least one of the holding-stubs is spring-loaded by the compressible spring;
   at least one hollow tube,
      held at each end by one of the holding-stubs,
      compressed along its longitudinal axis by the compression spring, and
      having at least one lateral hole to distribute the received precursors,
   at least one electrical source capable of generating an electric field to excite precursors into a plasma,
   at least one electrical connection to the electrical source through at least one of the manifold blocks, and
   at least one electrical insulator configured and positioned to insulate the electrical connection from the manifold block and from any other nearby electrical connections,
   where at least one of the electrical connections connects the electrical source to at least one of the holding-stubs, and
   each of the connected holding-stubs has a conductive portion that conducts electricity from the holding-stub to the hollow tube held by the holding-stub.

2. The showerhead of claim 1, where at least one of the holding-stubs for each of the hollow tubes further comprises:
   a narrow snout that compresses the compression spring when a tube is installed, and
   a shoulder that mates with a mating surface sealed to the manifold block when the compression spring is compressed.

3. The showerhead of claim 2, where at least one of the holding-stubs and at least one end of at least one of the tubes are capable of mating by contact between a concave conical surface and a convex spherical surface.

4. The showerhead of claim 1, where at least one of the electrical connections connects the electrical source to at least one of the hollow tubes.

5. The showerhead of claim 1, where at least one of the holding-stubs for each of the hollow tubes further comprises:
   a narrow snout that compresses the compression spring when a tube is installed, and
   a shoulder that mates with a mating surface sealed to the manifold block when the compression spring is compressed.

6. The showerhead of claim 5, where at least one of the holding-stubs and at least one end of at least one of the tubes are capable of mating by contact between a concave conical surface and a convex spherical surface.

7. The showerhead of claim 1, where the electrical insulator is also configured to mechanically and thermally insulate the holding-stub, and prevent unwanted buildup of deposits on the holding-stub.

8. The showerhead of claim 7, where the electrical insulator further comprises at least part of the seal.

9. The showerhead of claim 8, where at least one of the holding-stubs and at least one end of at least one of the tubes are capable of mating by contact between a concave conical surface and a convex spherical surface.

10. The showerhead of claim 9, where at least one of the holding-stubs for each of the hollow tubes further comprises:
    a narrow snout that compresses the compression spring when a tube is installed, and
    a shoulder that mates with a mating surface sealed to the manifold block when the compression spring is compressed.

11. The showerhead of claim 10, where the shoulder and its mating surface are capable of mating by contact between a concave conical surface and a convex spherical surface when the compression spring is compressed.

* * * * *